(12) United States Patent
Gamache et al.

(10) Patent No.: US 11,552,443 B1
(45) Date of Patent: Jan. 10, 2023

(54) MANAGING OPTICAL POWER IN A LASER

(71) Applicant: Ciena Corporation, Hanover, MD (US)

(72) Inventors: Claude Gamache, Gatineau (CA);
Antoine Bois, Quebec (CA);
Marie-Josee Picard,
L'Ancienne-Lorette (CA)

(73) Assignee: Ciena Corporation, Hanover, MD (US)

( * ) Notice: Subject to any disclaimer, the term of this patent is extended or adjusted under 35 U.S.C. 154(b) by 215 days.

(21) Appl. No.: 17/026,979

(22) Filed: Sep. 21, 2020

Related U.S. Application Data

(60) Provisional application No. 62/903,135, filed on Sep. 20, 2019.

(51) Int. Cl.
| | |
|---|---|
| *H01S 3/137* | (2006.01) |
| *G02F 1/21* | (2006.01) |
| *H01S 3/13* | (2006.01) |
| *H01S 3/067* | (2006.01) |
| *H01S 3/00* | (2006.01) |

(52) U.S. Cl.
CPC ............. *H01S 3/137* (2013.01); *G02F 1/21* (2013.01); *H01S 3/005* (2013.01); *H01S 3/06791* (2013.01); *H01S 3/1305* (2013.01); *G02F 1/212* (2021.01); *G02F 1/213* (2021.01); *G02F 2201/16* (2013.01)

(58) Field of Classification Search
CPC ...... H01S 3/137; H01S 3/005; H01S 3/06791; H01S 3/1305; G02F 1/21; G02F 1/212; G02F 1/213; G02F 2201/16
See application file for complete search history.

(56) References Cited

U.S. PATENT DOCUMENTS

| | | | | |
|---|---|---|---|---|
| 5,091,983 A | * | 2/1992 | Lukosz | ............... G02B 6/24 |
| | | | | 250/231.19 |
| 6,567,432 B1 | * | 5/2003 | Kim | ............... H01S 3/067 |
| | | | | 385/24 |
| 6,744,947 B2 | * | 6/2004 | Burns | ............... H01S 3/06795 |
| | | | | 359/341.1 |
| 6,845,108 B1 | * | 1/2005 | Liu | ............... H01S 3/1109 |
| | | | | 372/20 |
| 2006/0126682 A1 | * | 6/2006 | Rodin | ............... G02F 1/3532 |
| | | | | 372/30 |
| 2012/0226118 A1 | * | 9/2012 | Delbeke | ............... A61B 5/0031 |
| | | | | 600/316 |

(Continued)

*Primary Examiner* — Xinning(Tom) Niu
(74) *Attorney, Agent, or Firm* — Young Basile Hanlon & MacFarlane, P.C.

(57) ABSTRACT

A gain medium is pumped by a source. An optical wave passes through a photonic integrated circuit (PIC) that comprises: a substrate comprising Silicon, a plurality of photonic structures, an input port coupling an optical wave into a waveguide formed in the PIC, and an output port coupling an optical wave out of a waveguide formed in the PIC. Propagation of an optical wave circulating around a closed path of a laser ring cavity is limited using an optical isolator such that, when the pump source exceeds a lasing threshold, the optical wave propagates in a single direction through the gain medium and the PIC. From output coupler, an output that is provided that comprises a fraction of the power of an optical wave that is incident upon the output coupler, and remaining power of the optical wave is redirected around the closed path of the laser ring cavity. The fraction can be greater than 0.5.

19 Claims, 20 Drawing Sheets

(56) References Cited

U.S. PATENT DOCUMENTS

| | | | |
|---|---|---|---|
| 2015/0255944 A1* | 9/2015 | Li | H01S 3/06712 |
| | | | 372/6 |
| 2016/0085038 A1* | 3/2016 | Decker | G02B 6/428 |
| | | | 385/14 |
| 2016/0218481 A1* | 7/2016 | Akiyama | G02F 1/225 |
| 2018/0102628 A1* | 4/2018 | Parker | G02B 6/29353 |
| 2019/0267779 A1* | 8/2019 | Baehr-Jones | H01S 5/1028 |

* cited by examiner

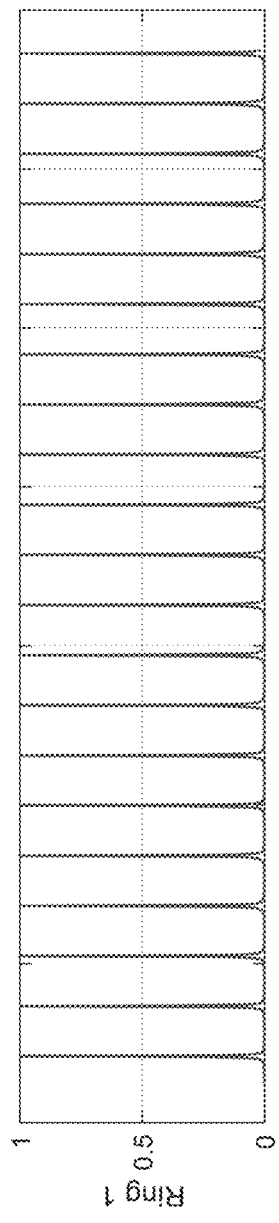
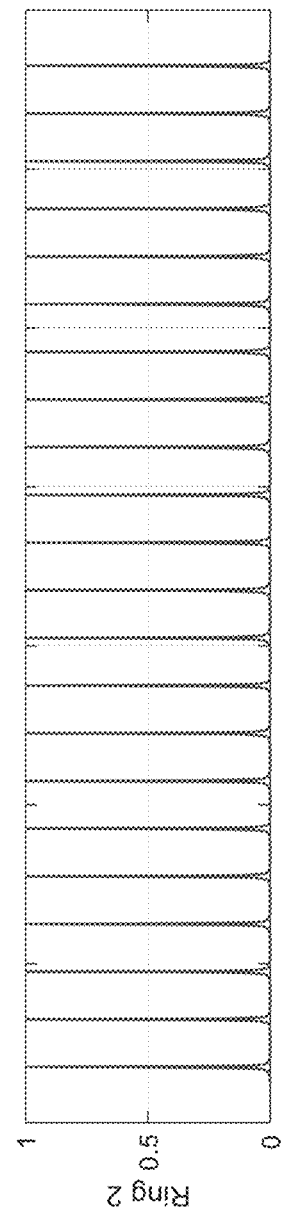
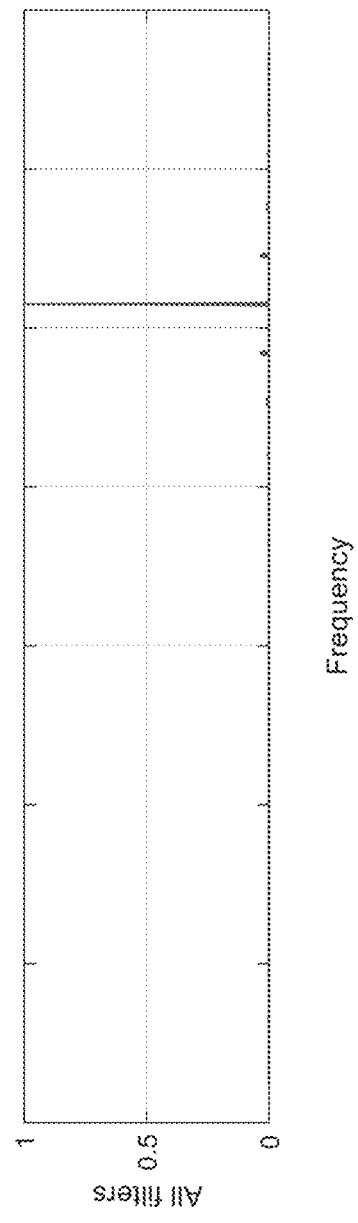
FIG. 4A
FIG. 4B
FIG. 4C

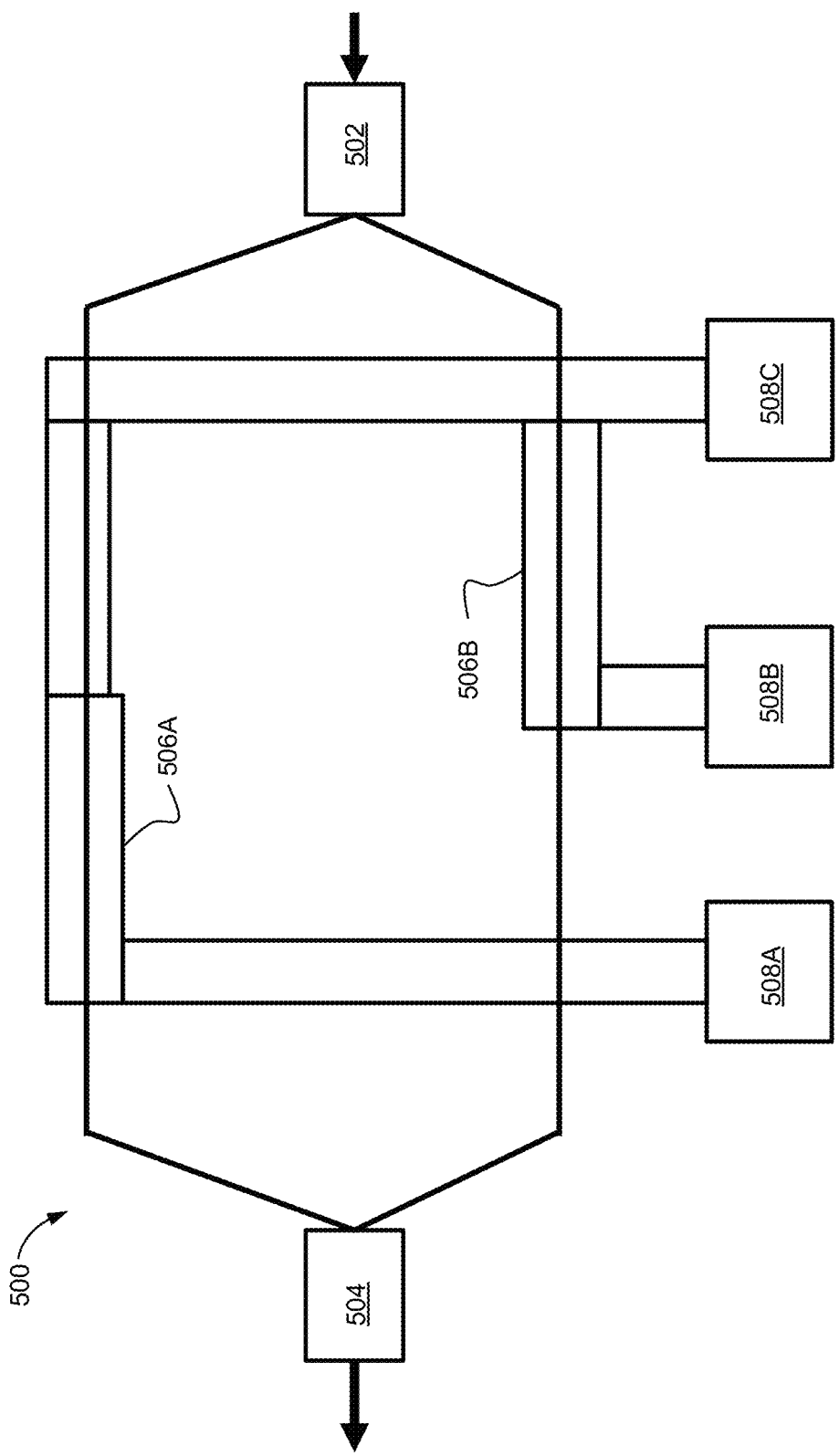

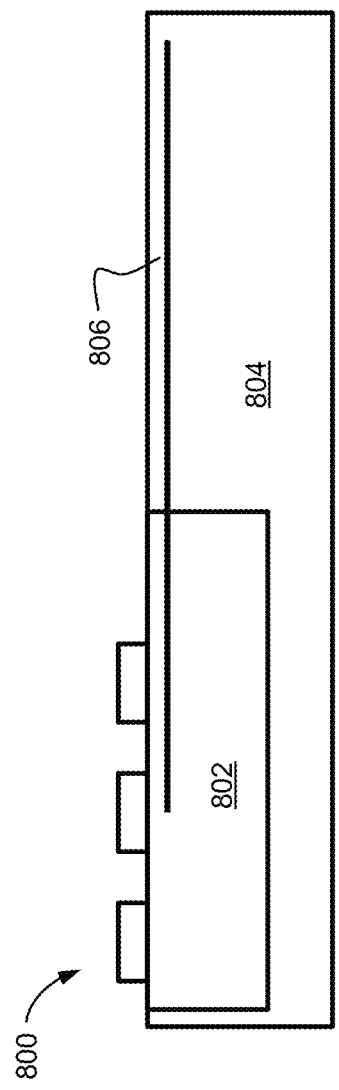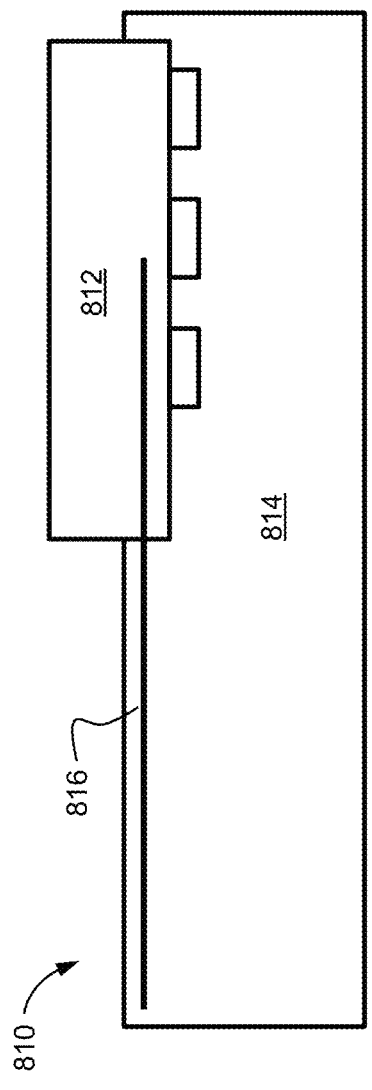
FIG. 8A
FIG. 8B

MANAGING OPTICAL POWER IN A LASER

CROSS-REFERENCE TO RELATED APPLICATION(S)

This application claims priority to and the benefit of U.S. Provisional Application Patent Ser. No. 62/903,135, filed Sep. 20, 2019, the entire disclosure of which is hereby incorporated by reference.

TECHNICAL FIELD

This disclosure relates to managing optical power in a laser.

BACKGROUND

Some laser configurations, such as DS-DBR lasers (i.e., digital super-mode (DS) distributed Bragg reflector (DBR) lasers), may include compact photonic structures for certain features, but may also include certain external modules, such as an external frequency locker or a wavemeter module. Such external modules may use a relatively large amount of physical space. Additionally, some laser cavities that include a photonic integrated circuit (PIC) on a chip, such as a Silicon Photonics (SiPhot) chip, may result in relatively high optical power within the chip, which can lead to impairments due to nonlinear effects. The gain can be limited to limit the optical power circulating within, and output from, such a laser. But, such laser configurations may also rely on an external booster semiconductor optical amplifier (SOA), which may also increase the physical space used.

SUMMARY

In one aspect, in general, an apparatus comprises: a gain medium configured to be pumped by a pump source; a photonic integrated circuit (PIC) comprising: a substrate comprising silicon, a plurality of photonic structures, an input port coupling an optical wave into a waveguide formed in the PIC, and an output port coupling an optical wave out of a waveguide formed in the PIC; an optical isolator configured to limit propagation of an optical wave circulating around a closed "ring path" of a laser ring cavity such that, when the pump source exceeds a lasing threshold, the optical wave propagates in a single direction through the gain medium and the PIC; and an output coupler configured to provide an output that comprises a fraction of the power of an optical wave that is incident upon the output coupler and to redirect remaining power of the optical wave around the closed path of the laser ring cavity, where the fraction is greater than 0.5.

In another aspect, in general, a method comprises: pumping a gain medium by a pump source; passing an optical wave through a photonic integrated circuit (PIC) that comprises: a substrate comprising Silicon, a plurality of photonic structures, an input port coupling an optical wave into a waveguide formed in the PIC, and an output port coupling an optical wave out of a waveguide formed in the PIC; limiting propagation of an optical wave circulating around a closed path of a laser ring cavity using an optical isolator such that, when the pump source exceeds a lasing threshold, the optical wave propagates in a single direction through the gain medium and the PIC; and providing, from output coupler, an output that comprises a fraction of the power of an optical wave that is incident upon the output coupler, and redirecting remaining power of the optical wave around the closed path of the laser ring cavity, where the fraction is greater than 0.5.

Aspects can include one or more of the following features.

The PIC positioned in the laser ring cavity such that the optical wave propagating on a portion of the closed path between the gain medium and the PIC is redirected by the output coupler after exiting the gain medium and before being received at the input port of the PIC.

The laser ring cavity comprises a plurality of frequency selective filters for selecting a frequency of the output, including a coarse frequency selective filter characterized by a first linewidth, and a fine frequency selective filter characterized by a second linewidth, where the second linewidth is smaller than the first linewidth. In some implementations the frequency selection is tunable using a tuning mechanism that enables an operator to change the selection of the output frequency, and in other implementations the frequency selection if fixed without necessarily providing such a tuning mechanism.

The coarse frequency selective filter comprises at least one of the photonic structures in the PIC.

The coarse frequency selective filter comprises at least one Mach-Zehnder interferometer.

The coarse frequency selective filter comprises a plurality of Mach-Zehnder interferometers in series configured to substantially align their transmission peaks for a selected frequency.

The fine frequency selective filter is located outside of the PIC.

The fine frequency selective filter comprises a Fabry-Perot filter.

The fine frequency selective filter comprises a ring resonator formed from at least one of the photonic structures in the PIC.

The laser ring cavity comprises one or more frequency selective filters for selecting a frequency of the output, including a first filter characterized by a first free spectral range cascaded with a second filter characterized by second free spectral range, where the second free spectral range is different from the first free spectral range. In some implementations the frequency selection is tunable using a tuning mechanism that enables an operator to change the selection of the output frequency, and in other implementations the frequency selection if fixed without necessarily providing such a tuning mechanism.

The plurality of photonic structures comprise at least two of: a frequency selective filter, a photodiode, a frequency locker, or a wavemeter.

The plurality of photonic structures comprise a waveguide splitter that splits off a portion of the optical wave propagating between the input port and the output port of the PIC.

The waveguide splitter provides the portion of the optical wave to at least one of the photonic structures in the PIC.

The gain medium is mounted on the PIC using a flip-chip mounting configuration, or an epi-up mounting configuration.

The optical isolator comprises a non-reciprocal optical medium, and is located outside the PIC.

The fraction is greater than 0.8.

The optical isolator is formed in the PIC.

The output coupler is formed in the PIC.

Aspects can have one or more of the following advantages.

The use of one or more SiPhot chips in a tunable laser module enables integration of various useful functionalities for the laser including: optical filtering, lasing frequency selection, frequency monitoring, and/or optical power level monitoring. Compared to lower index alternatives, the use of silicon for frequency selection, for example, makes thermal tuning more efficient through a larger thermo-optic coefficient and as such simplifies the thermal budget, and enables a smaller more compact design.

Silicon can exhibit detrimental nonlinear optical behavior when the optical power level exceeds a certain level (e.g., as low as around 10 mW in some cases). Some implementations of tunable lasers that include a PIC (e.g., a SiPhot chip) are able to maintain a relatively low optical power level within the PIC (e.g., less than around 10 mW), which enables the integration, while still delivering a significant amount of optical power (e.g., approximately 90 mW) from an output coupler that can be coupled to an optical fiber. In some implementations, this can be accomplished without the use of a separate Booster Optical Amplifier (BOA) after the tunable laser, as described in more detail below. The reduction of potentially detrimental nonlinear effects also facilitates calibration (e.g., using integrated wavemeter and locker functions), which leads to a potential cost reduction. For example, there can be a reduction in the time spent calibrating, and/or the number of components used within or coupled to the laser module. Use of calibration during laser operations can also provide greater frequency accuracy over product life and over operating temperatures.

Generally, lasers, as described herein, provide electromagnetic waves that have a spectrum that has a peak wavelength that falls in a particular range of optical wavelengths (e.g., between about 100 nm to about 1 mm, or some subrange thereof), also referred to as optical waves, light waves, or simply light.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 4A-4C are plots of example frequency responses.

FIG. 5 is a schematic diagram of an example MZI photonic circuit.

FIGS. 8A and 8B are schematic diagrams of different example configurations for gain chip integration.

DETAILED DESCRIPTION

Figure 1:
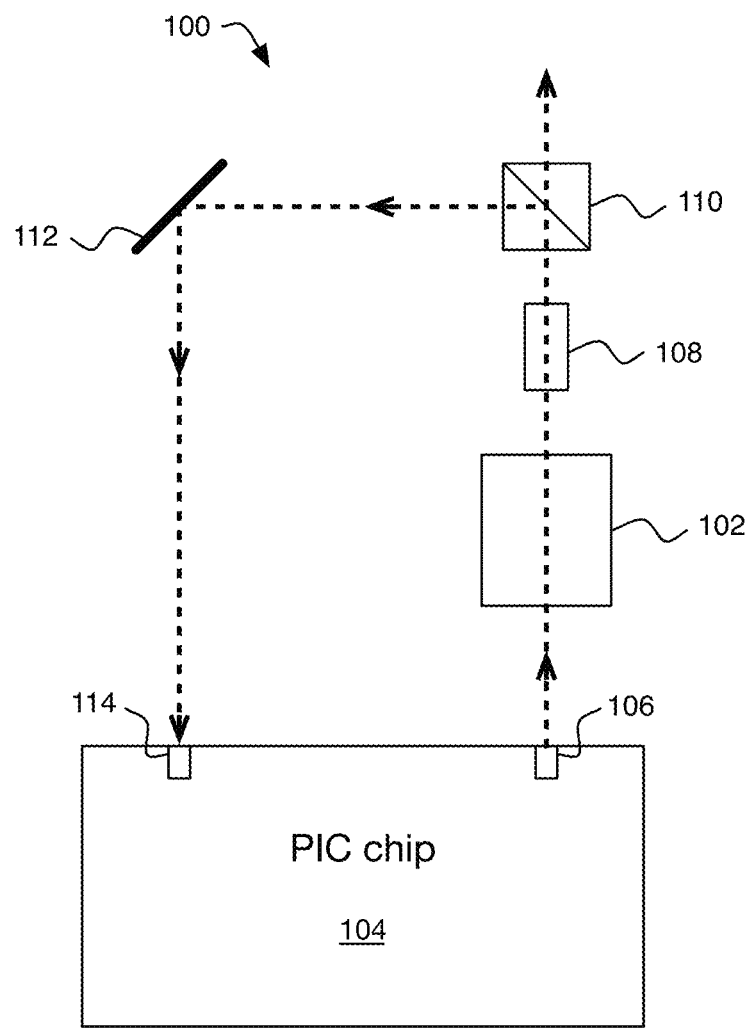
FIG. 1 is a schematic diagram of an example configuration of a ring laser cavity.

A variety of ring laser configurations for a tunable laser module, as described herein, enable a low fraction of the output of a gain chip back into the ring lasing cavity, that allow low optical power levels in a SiPhot chip to avoid nonlinear effects in the silicon. An isolator can also be included within the cavity to limit the ring laser to unidirectional propagation. The relatively large optical power output coupling (e.g., greater than about 50% of the power) located relatively close to the output of a gain chip limits the optical power in the SiPhot chip. Such power limiting techniques allow for a higher level of integration in the laser. With a higher level of integration, more functions can be provided within the SiPhot chip, which enables the dimensions of the laser module to be kept relatively small. In some embodiments, flip-chip mounting of the gain chip on the SiPhot chip can be used to keep the dimensions small. Any of a variety of other techniques could be used for optically connecting the gain chip and the SiPhot chip. For example, epitaxial-side-up (epi-up) die bonding can be used to bond the gain chip to the SiPhot chip in a cavity formed by deep reactive ion etching (DRIE), or chemical etching and DRIE. Micro-transfer printing can be used, where an engineered elastomer stamp coupled to a precision motion controller is used to pick up and transfer one or more microscale devices. A gain chip spot-size converter (SSC) can be connected to a SiPhot chip SSC using optical wire-bonding (e.g., with the gain chip on top of or at the side of the SiPhot chip). Back-side-on box (BSoBOX) bonding can be used. The gain chip can also be butt-coupled to a SiP SSC on one side and coupled through air on the other side. These techniques can be used without exposing the SiPhot chip to large amount of optical power, which could lead to detrimental nonlinear effects.

The examples described herein demonstrate a high output optical power single-gain-chip ring-cavity tunable laser, without the need for a second booster optical amplifier (BOA). Use of such a BOA could potentially reduce the optical signal-to-noise ratio (OSNR), affecting performance and potentially increasing overall power consumption of the tunable laser module and/or the size of the tunable laser module. In addition to relatively high output optical power and relatively low internal optical power, the laser configurations described herein can achieve a narrow laser linewidth and a low relative intensity noise (RIN).

The use of a PIC, such as a SiPhot chip, allows the integration of tunable optical filters used as a partial selector (e.g., in conjunction with an external Fabry-Perot filter for fine frequency selection, as described in more detail below), or as a compound Vernier filter (e.g., directly without requiring an external Fabry-Perot filter using multiple ring resonators or Mach-Zehnder interferometers (MZIs) in the SiPhot chip, as described in more detail below). These techniques can be used to enable a single mode with high side-mode suppression ratio (SMSR), lasing condition. The techniques can also be used to provide optical power monitoring, polarization management, and to integrate wavelength locker and/or wavemeter functions, as mentioned above. The PIC also allows the ring-cavity laser cavity length to be shorter since the optical filters of the PIC use significantly less space and length than equivalent free space optical filters. Specific mode profiles and/or waveguide geometry can be used in the PIC to reduce waveguide back-scattering and insertion loss. For example, rib waveguide geometry can be used, and TM mode propagation and/or multimode waveguides can be used.

FIG. 1 shows an example of a configuration of a ring laser 100 used for some implementations described herein. The ring laser 100 includes a gain medium 102 configured to be pumped by a pump source (e.g., a semiconductor gain medium that is pumped by a current source to achieve population inversion when pumped over a lasing threshold for stimulated emission of optical radiation). A PIC chip 104 is included as part of a closed path of a laser ring cavity. The PIC chip 104 comprises a substrate (e.g., Silicon or Silicon-on-Insulator) and multiple photonic structures fabricated on the substrate. The PIC chip 104 has an output port 106 that couples an optical wave out of a waveguide formed in the PIC chip 104 and into the gain medium 102. On the other side of the gain medium 102 is an optical isolator 108 configured to limit propagation of an optical wave circulating around the closed path of the laser ring cavity such that, when the pump source exceeds a lasing threshold, the optical wave propagates in a single direction through the gain medium and the PIC chip 104. An output coupler 110 is configured to provide an output that includes a fraction of the power of an optical wave that is incident upon the output coupler 110. The output coupler 110 also redirects the remaining power of the optical wave around the closed path of the laser ring cavity. For example, the fraction of the power that is output from the output coupler 110 can be configured to be greater than 0.5, or greater than 0.8, or around 0.9. A reflector 112 then closes the path of the ring laser 100 by directing the optical wave to an input port 114 of the PIC chip 104, which couples an optical wave into a waveguide formed in the PIC chip 104.

A tunable laser module using such a ring laser cavity configuration for optical power limiting is able to systematically take the optical beam from the gain chip (e.g., in air), split the optical beam, and route the vast majority of the light to an output optical fiber or an optical receptacle and only route a small fraction of the light back into the SiPhot chip. Further, this technique enables mounting of the gain chip on the SiPhot chip in some embodiments, to save more space. Various ways of closing the optical ring cavity and providing the output coupling are described herein. Some implementations use 90 degree reflectors, and some implementations are more integrated (e.g., using the reflection off the output window). Use of two lenses with different focal lengths, for example, allows selection of the proper magnification for the two chips, as described in more detail below.

In ring cavity lasers, formation of a cavity calls for a certain amount of space. In order to avoid high optical power levels in the SiPhot chip, the immediate output of the gain chip can be provided in air and split there before being redirected back into the SiPhot chip. Further, to avoid lasing in both directions (i.e., clockwise and counterclockwise), an optical isolator can be introduced into the cavity. Finally, getting in and out of the SiPhot and gain chips uses lenses to capture the light and provide the proper magnification (since the SiPot and gain chips have different mode field diameters).

Figure 2A:
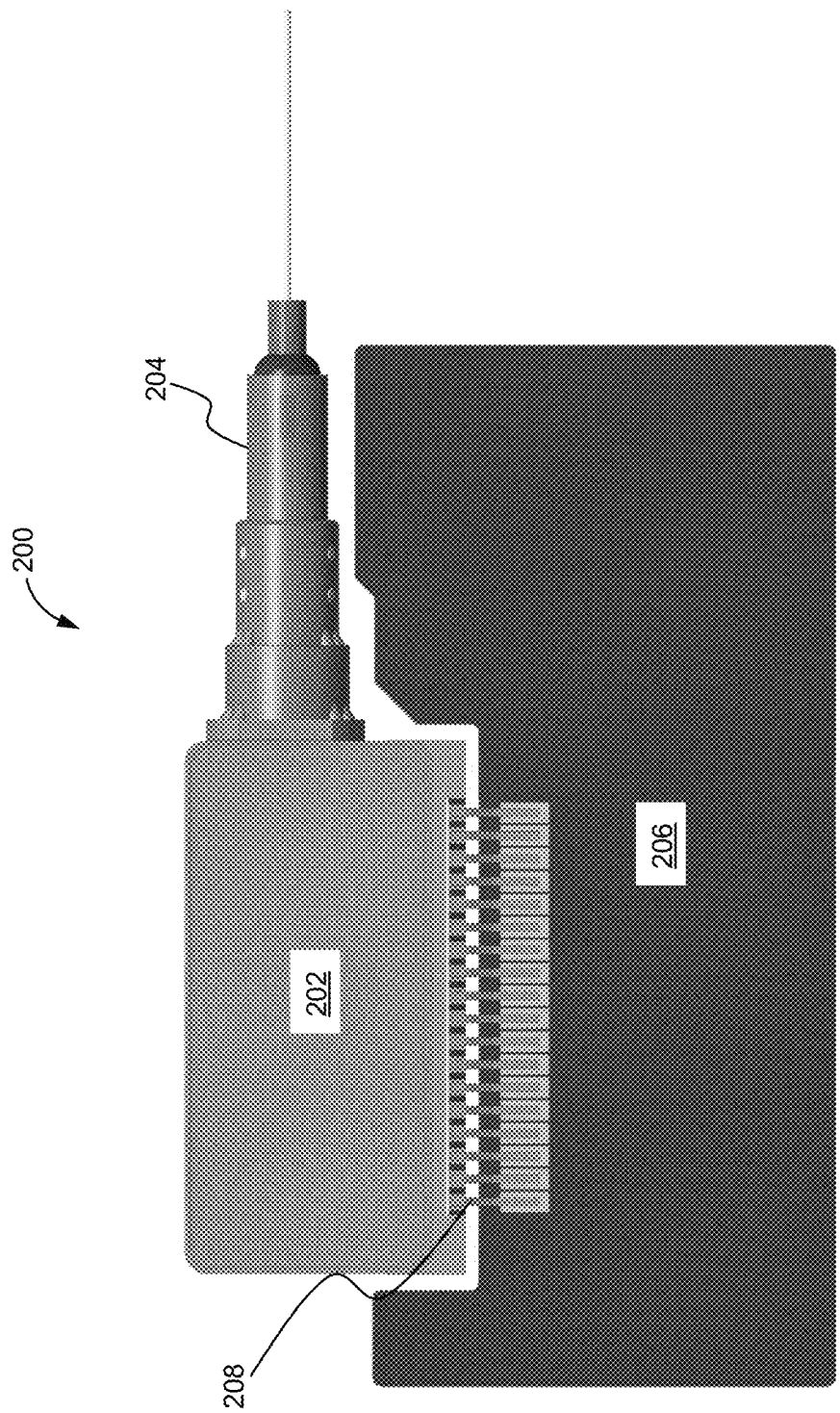
FIG. 2A is a view of an example laser system.

FIG. 2A shows an example of a laser system 200 that provides a compact form factor for an integrated tunable laser assembly (ITLA) package 202 that has an output fiber coupler 204 and a printed circuit board assembly (PCBA) 206 for control electronics that are coupled to the ITLA package 202 over an electrical connection interface 208. The output fiber coupler 204 is configured to be mated to a connector at the end of an optical fiber, as illustrated in the current example showing a "fiber optic pigtail" coupler. The laser system 200 can be used with any of a variety of products, such as an optical transceiver that has a relatively small size according to a desired form factor. For example, a Quad Small Form-Factor Pluggable Double Density (QSFP-DD) form factor may be used within an optical communication network to provide relatively low power operation over a desired wavelength band (e.g., the optical telecom C-band of wavelengths between 1530 to 1565 nm, L-band of wavelengths between 1565 nm to 1625 nm, and/or O-band of wavelengths between 1260 nm to 1360 nm, or any other optical wavelength band or set of bands).

Figure 2B:
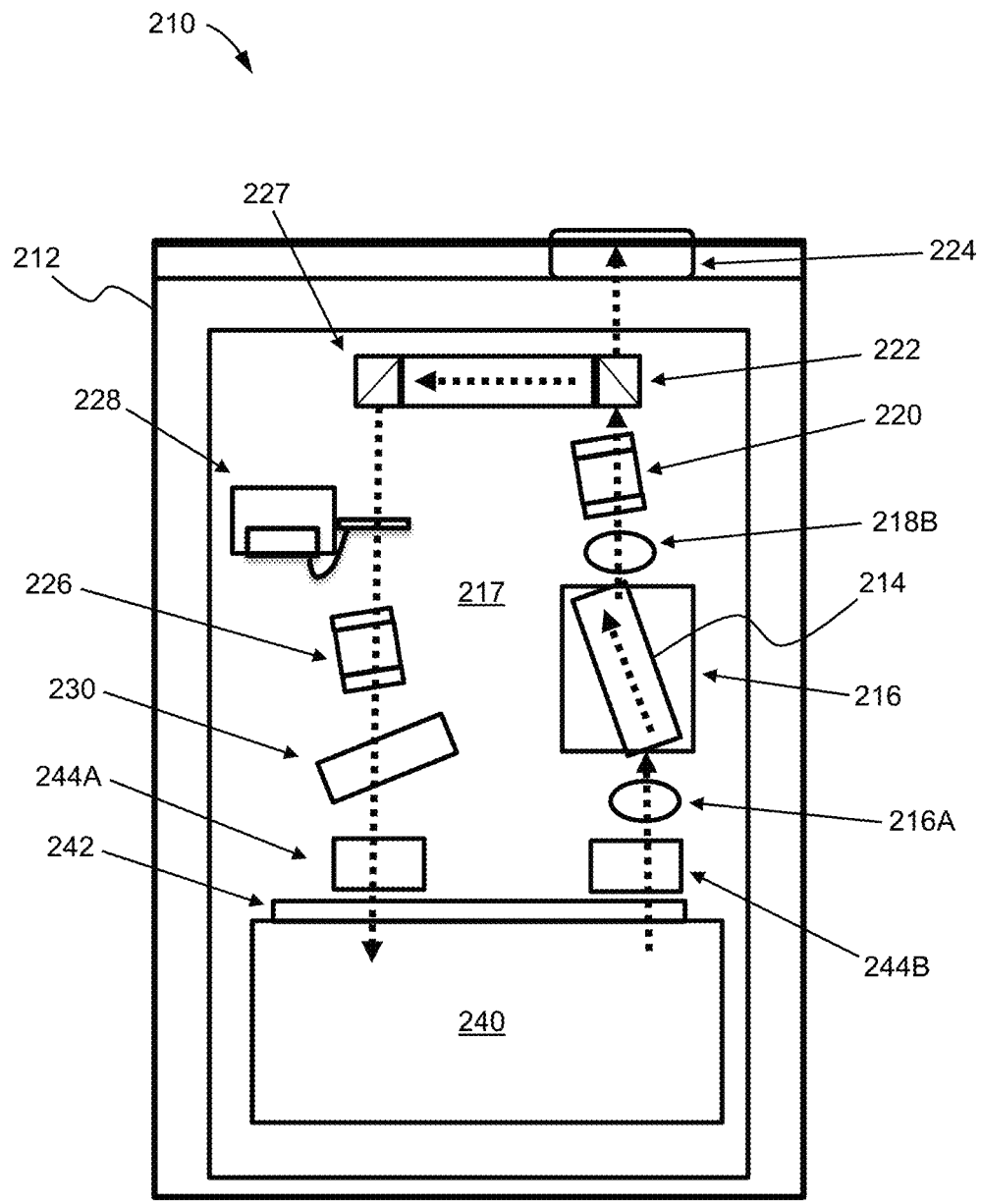
FIG. 2B is a schematic diagram of an example of a tunable laser module of the laser system of FIG. 2A.

FIG. 2B shows an example configuration of a tunable laser module 210 that fits within a housing 212 of the ITLA package 202. In this example, the housing 212 is composed of a nickel-cobalt ferrous alloy. The housing 212 in this example also has a relatively compact size (e.g., exterior dimensions of a 4 mm height, 5 mm width, and 12 mm length, with width and length being shown in this cross-sectional view). The dashed arrows in this figure show the direction of propagation of light within the free space and bulk optics portions of the tunable laser module 210 (and light paths within waveguides in the PIC chip 240 are not shown). A gain medium is provided as a gain chip 214 that is mounted on a compact carrier 216 (e.g., having a few mm length). The gain chip 214 can be pumped to provide a particular single-pass gain, for example, of a factor of 10 such that a 10-mW beam of light input into the gain chip 214 is amplified to yield a 100-mW beam of light output from the gain chip 212. This round-trip gain makes up for the round-trip cavity losses in the rest of the module 210, including the output coupling loss, to provide a stable output power. A temperature management system 217 includes a thermal sensing module (e.g., a thermistor) and a thermal control module (e.g., a thermo-electric cooler) configured to dissipates heat (e.g., into a heat sink) to maintain a stable temperature within the tunable laser module 210. There is a small spacing between the walls of the housing 212 and the edges of the temperature management system 217. Lenses 218A and 218B at the input and output of the gain chip 214, respectively, provide mode matching to achieve the appropriate transverse beam profile of the light beams. For example, these lenses 218A and 218B can be glass molded lenses.

An optical isolator 220 ensures that light can only propagate with low loss in one direction by imposing extreme loss in the other direction (e.g., based on a non-reciprocal medium, such as a medium that induces Faraday rotation of polarization). The optical isolator 220 can be configured to have a compact size, for example, shorter than 1 mm in length. Additionally, the gain chip 214, and some of the other components in the tunable laser module 210 can be rotated with respect to the input and output facets, as shown, to further reduce power propagating in the opposite direction due to reflections. Optionally, in some implementations, an additional optical isolator 226 can be included on the other side to provide an even stronger suppression of optical power in the reverse direction.

An output coupler 222 splits a predetermined fraction of the power (e.g., more than half, or in some implementations between around 75%-95%) to be provided as an output beam of light and reflects the rest of the light to continue circulating around the ring path of the tunable laser module 210. The output beam of light passes through a beam coupler 224 in an opening in the housing 212 to pass the output beam into the output fiber coupler 204. A reflector 227 redirects the optical beam toward the other elements of the tunable laser module 210.

Free space filters can be included to provide a desired spectrum for the output light. A high-finesse Fabry-Perot filter 228 serves as a fine frequency selector (FFS) to help ensure a narrow linewidth, as described in more detail below. A broader bandwidth wavelength bandpass filter 230 is used in this example to filter out the spontaneous emission coming from the gain chip 212 over all but a desired output wavelength band (e.g., the optical C-band, L-band, or O-band), which prevents the laser cavity from lasing outside that output wavelength band.

A PIC chip 240 can be configured in different ways to select and tune the narrowband lasing wavelength over the output wavelength band using integrated semiconductor optical elements. For example, the PIC chip 240 can be a SiPhot chip that has a relatively small size (e.g., a few mm width and length). In some implementations, a glass block 242 on the input and output facets of the PIC chip 240 has anti-reflection (AR) coated surfaces, and is shaped (e.g., as a prism) to correct for the optical beam angle if the facet of the PIC chip 240 has an angle. The glass block 242 provides a large surface, which allows high quality and high yield coating to be applied. In some implementations, is possible to remove the standalone bandpass filter 230 and instead form an AR coating on the glass block 242 with an appropriate spectral passband to provide the bandpass filtering. Or, any other appropriate surface can be coated to provide the bandpass filtering, such as an output surface of the reflector 227. Lenses 244A and 244B provide mode matching to achieve the appropriate transverse beam profile of the light beams propagating through the glass block 242 to and from waveguides at an edge facet of the PIC chip 240, respectively. For example, these lenses 244A and 244B can be formed as silicon lenses.

Figure 2C:
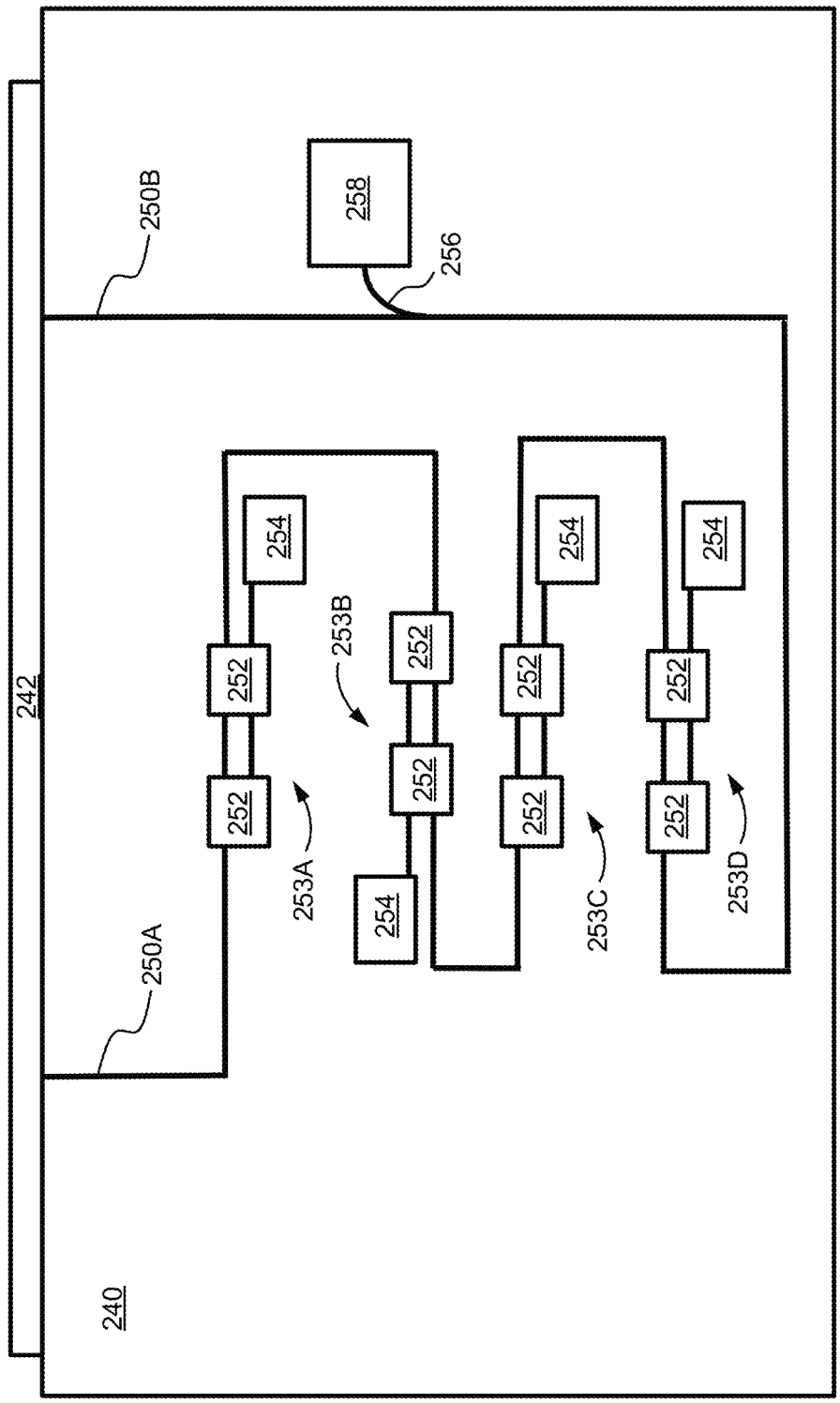
FIG. 2C is a schematic diagram of an example PIC chip used in the tunable laser module of FIG. 2B.

FIG. 2C shows an example of the PIC chip 240 including several optical filters to provide coarse frequency selection. In this example, there are 4 cascaded MZI filters, but other examples can include more or fewer optical filters (e.g., between 3 to 6 in some implementations), and/or other types of optical filters. There are input and output waveguides that serve as spot size converters (e.g., using adiabatically tapered portions of the waveguides) couple light to and from the cascaded MZIs. In particular, optical couplers 252 (e.g., multimode interference 1×2 couplers and 2×2 couplers) are arranged to form MZI filters 253A, 253B, 253C, and 253D, with one coupler output port of each MZI filter connected to the next MZI filter in series and the other coupler output ports coupled to monitor photodiodes 254 for monitoring power after each MZI filter. After the MZI filters, an optical tap waveguide 256 splits a predetermined fraction of the optical power to an optical power monitoring module 258 that includes another photodiode. The optical power monitoring module 258 can also be configured to provide other functionality, including frequency locker and wavemeter functionality. The photodiodes can be configured to provide detected photocurrent to appropriate optical detection circuitry (e.g., a transimpedance amplifier). In the implementation shown in this example, the integrated MZI filters provide coarse frequency selection, and fine frequency selection is provided by the Fabry-Perot filter 228 outside of the PIC chip 240. Alternatively, in other implementations, optical filters within the PIC chip 240 can provide fine frequency selection with the appropriate configuration of optical filters (e.g., ring resonators, or an integrated Fabry-Perot filter) without the need for a fine frequency selection filter outside the PIC chip 240, as described in more detail below. Also, in some implementations, the PIC chip 240 includes a shallow cavity that enables flip-chip mounting of the gain chip 214 directly on the PIC chip 240.

Figure 3A:
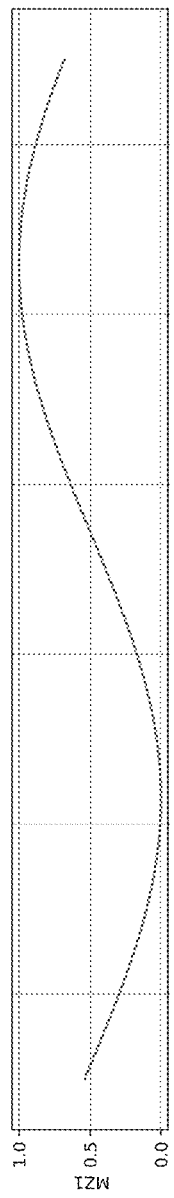
FIGS. 3A-3F are plots of example frequency responses.
Figure 3B:
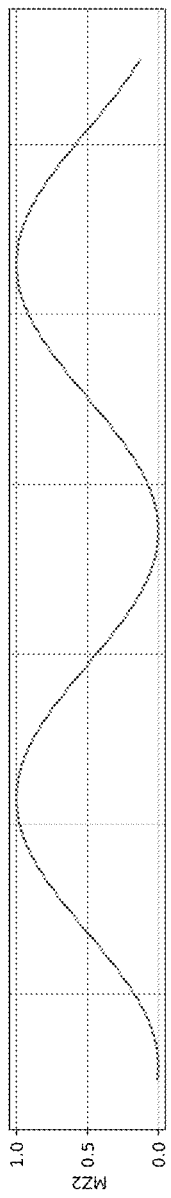
Figure 3C:
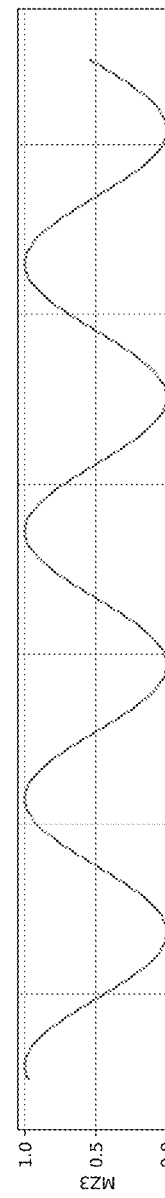
Figure 3D:
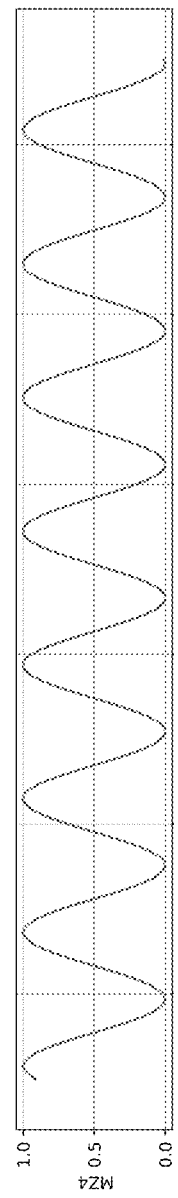
Figure 3E:
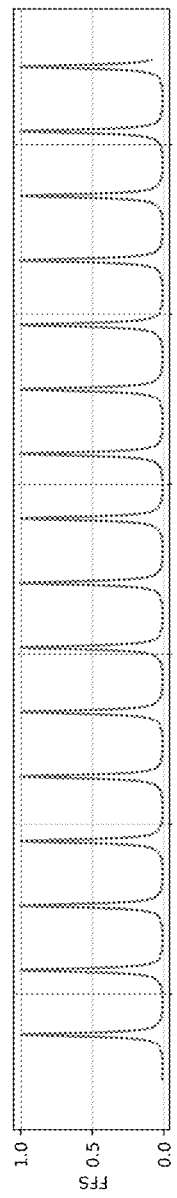
Figure 3F:
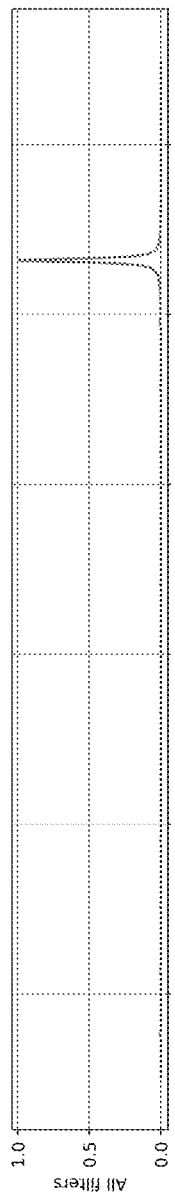

FIGS. 3A-3F show example frequency responses for the cascaded MZI filters 253A, 253B, 253C, and 253D in the PIC chip 240 used in combination with the free space Fabry-Perot filter 228 as an FFS filter. The frequency responses are shown as plots of optical transmission (between 0 for No transmission and 1 for full transmission) as a function of frequency (e.g., over a frequency range corresponding to the optical C-band, L-band, or O-band). FIG. 3A shows the frequency response for the MZI filter 253A (labeled "MZI1") having a relatively large free spectral range (FSR). FIG. 3B shows the frequency response for the MZI filter 253B (labeled "MZI2") having an FSR that is half the FSR of MZI1. FIG. 3C shows the frequency response for the MZI filter 253C (labeled "MZI3") having an FSR that is half the FSR of MZI2. FIG. 3D shows the frequency response for the MZI filter 253D (labeled "MZI4") having an FSR that is half the FSR of MZI3. FIG. 3E shows the frequency response for the Fabry-Perot filter 228 (labeled "FFS") having an FSR and 3 dB bandwidth as shown to yield a relatively high finesse. FIG. 3F shows the frequency response for the cascaded transmission through all of the MZI filters and the FFS filter, with the respective maximum transmission frequencies aligned appropriately to provide a single tunable peak at a desired lasing frequency (e.g., using temperature tuning, or carrier injection based electro-optical tuning). In this example, all of the filters have a phase tuning range of at least ±270 degrees.

A variety of alternative implementations are possible. For example, if the optical power level in the PIC chip 240 is kept relatively low, then instead of relying on the external Fabry-Perot filter 228 for fine frequency selection, a FFS filter integrated within the PIC chip 240 can be used for fine frequency selection with the MZI filters still providing coarse frequency selection. For example, an integrated FFS filter can be implemented using a ring resonator, a cascade of ring resonators, or a filter using Bragg gratings waveguides as reflectors. Such an integrated high finesse FFS filter can be directly implemented in the silicon layers or flip-chip mounted or inserted in an etched cavity on a silicon chip. A Fabry-Perot filter with etched facets can be integrated in-line with spot size converters on either side. Such integrated FFS filters are enabled by ensuring the optical power in the PIC chip is kept low enough such that there are no nonlinear effects that would cause optical loss and frequency shifts that have a detrimental effect on calibration and/or cause unreliable operation over time.

FIGS. 4A-4B show examples of frequency responses for an alternative implementation that uses two cascaded ring resonators integrated within the PIC chip as a Vernier filter instead of the MZI filters and used without a free space Fabry-Perot filter outside the PIC chip. FIG. 4A shows the frequency response for a first ring resonator (labeled "Ring 1") having a particular FSR. FIG. 4B shows the frequency response for a second ring resonator (labeled "Ring 2") having an FSR slightly different from the FSR of the first ring resonator. FIG. 4C shows the frequency response for the two ring resonators cascaded together as a Vernier filter. The two ring resonators with a slight mismatch in FSR, when tuned, provide a large extinction of sidelobes over a range inversely proportional to the difference in their FSR. The transmission of the first sidelobe is also inversely proportional to this difference. In this example, this first sidelobe is maintained at more than 10 dB extinction, and both of the ring resonators have a phase tuning range of at least ±270 degrees (e.g., using temperature tuning). In these ring resonators, the resonance enhances the intensity of optical fields within the waveguides, making them more sensitive to nonlinear effects. In addition to regular effects (e.g., nonlinear losses, frequency shift due to self-heating), there exists a possibility for an optical bistability to occur and for hysteresis to affect the tuning of the ring resonators. However, these effects should not arise for relatively low input power (e.g., around 10 mW, or less than a few tens of mW). In other implementations, additional ring resonators can be added to help distribute the power by reducing the bandwidth constraints on each ring resonator.

FIG. 5 shows an example photonic integrated circuit design for an MZI filter 500 that can be used in the PIC chip, such as the MZI filter 253A. The MZI filter 500 includes an input coupler 502 that splits an optical wave from an input waveguide into two waveguides, and in output coupler 504 that combines two phase shifted optical waves into an output waveguide. The MZI filter 500 includes a thermal phase shifter 506A in a first arm of the MZI and a thermal phase shifter 506B in a second arm of the MZI. The two thermal phase shifters control the amount of heat delivered to change the waveguide index, and thus the acquired optical phase shift, from a resistive element placed above or adjacent to the waveguides. In this push-pull design, a differential phase shift is applied by shifting the temperature and phase in opposite directions in the two arms. Metal contact pads 508A, 508B, and 508C provide electrical control and ground signals via metal traces to the phase shifters 506A and 506B, which can be connected to an electrical control source using any of a variety of techniques (e.g., wire bonding, copper pillars, and/or solder bumps).

Figure 6A:
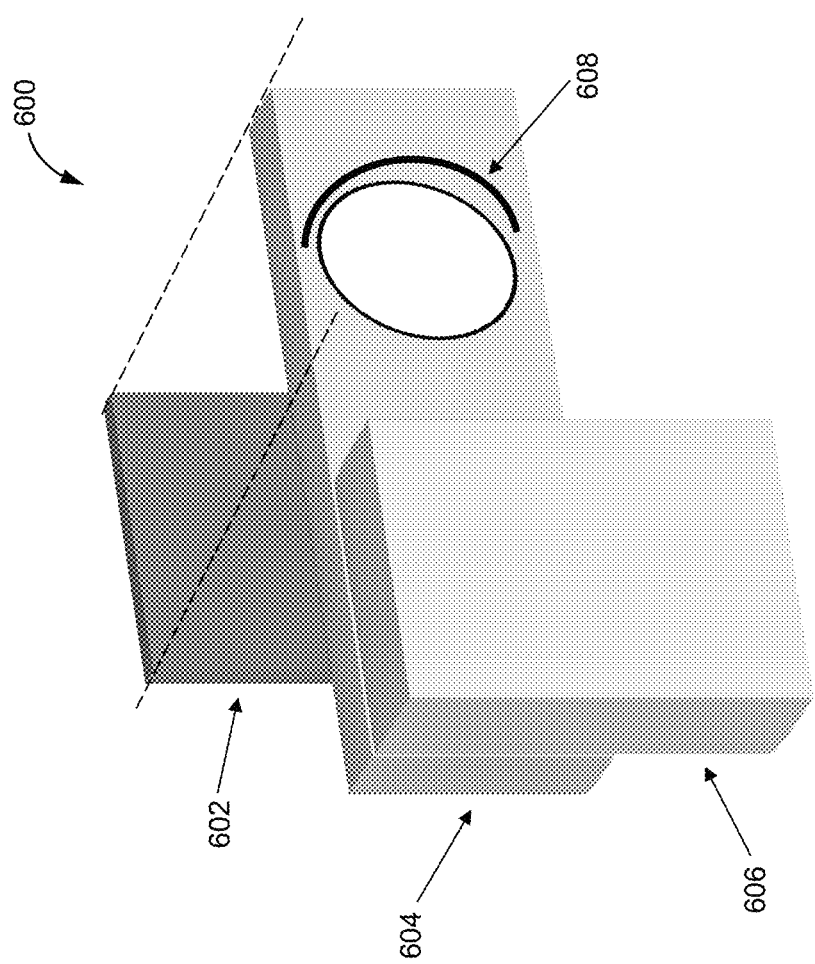
FIGS. 6A and 6B are views of portions of an example Fabry-Perot filter assembly.
Figure 6B:
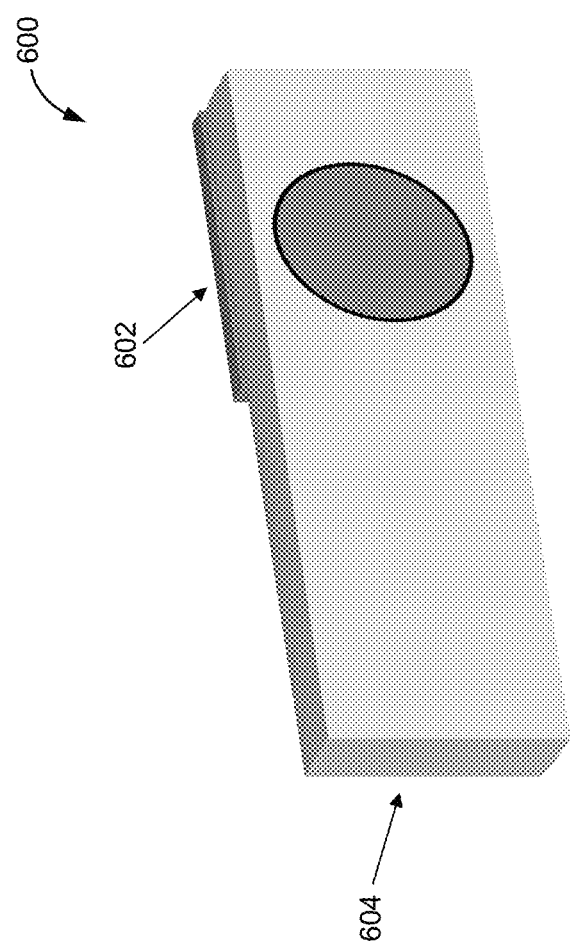

FIGS. 6A and 6B show example views of a free space Fabry-Perot filter 600 that can be used in the laser module as a fine frequency selector, such as the Fabry-Perot filter 228. Referring to FIG. 6A, the filter 600 includes a thin silicon plate 602 with surfaces that serve as etalon reflectors. The silicon plate 602 is attached to a glass plate 604 that has a through hole large enough for an optical beam to pass through without significant diffraction (e.g., a hole with a diameter less than 1 mm). The glass plate 604 is secured in place by attachment to a standoff structure 606. A platinum heater strip 608 is arranged around a portion of the hole in the glass plate 604, which enables thermal tuning of the silicon plate 602 optical cavity length (e.g., through index change and thermal expansion), and thus tuning of the FSR of the Fabry-Perot filter 600. There is also a temperature sensor (not shown), such as a platinum resistance temperature detector, to help control the temperature tuning. FIG. 6B shows the Fabry-Perot filter 600 in an assembled state with the silicon plate 602 attached to the glass plate 604. Such a free space fine frequency selector is useful, for example, if the optical power level in the PIC is not low enough to avoid the more sensitive nonlinear effects.

FIGS. 7A-7I show different example implementations of tunable laser modules that include different elements and/or a different arrangement of elements with respect to the example tunable laser module 210 described above with reference to FIG. 2B.

Figure 7A:
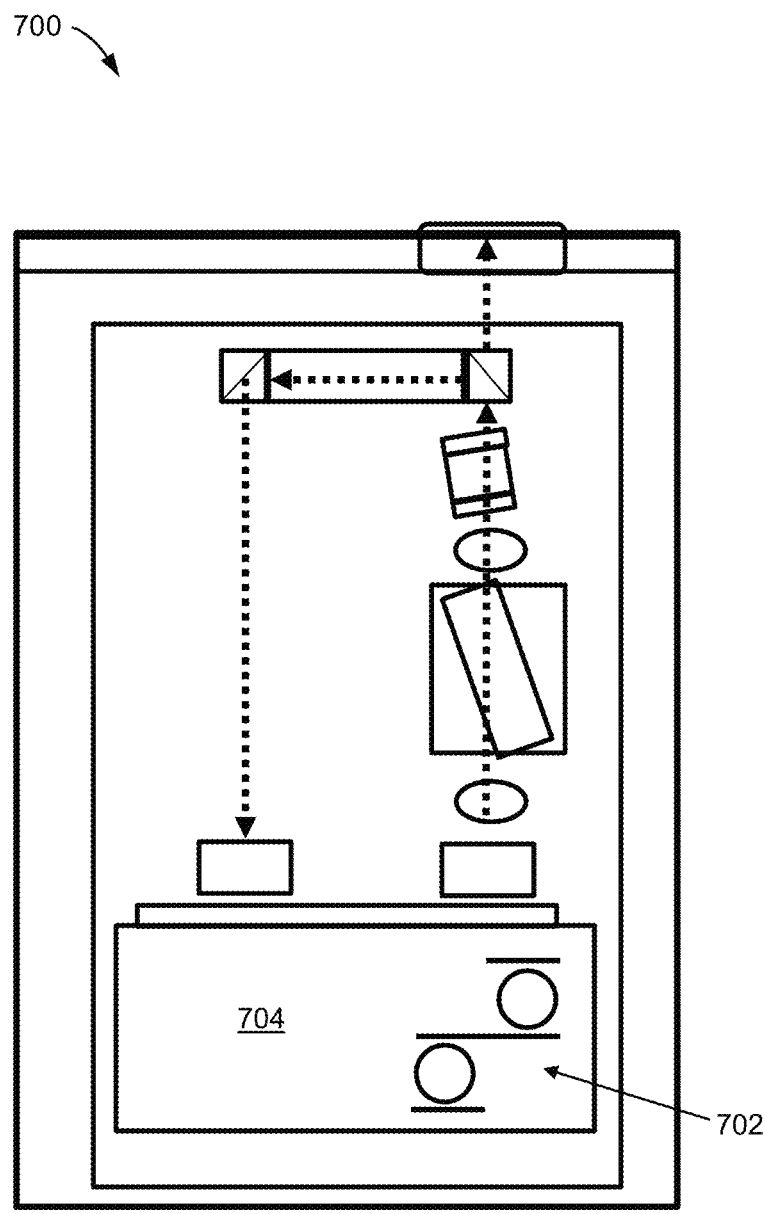
FIGS. 7A-7I are schematic diagrams of different examples of tunable laser modules.

Referring to FIG. 7A, an alternative implementation of a tunable laser module 700 includes two cascaded ring resonators 702 integrated within the PIC chip 704 to replace the MZI filters 253A, 253B, 253C, and 253D and the Fabry-Perot filter 228, resulting in a simpler laser cavity (e.g., with potentially lower optical loss, and fewer control elements needed).

Figure 7B:
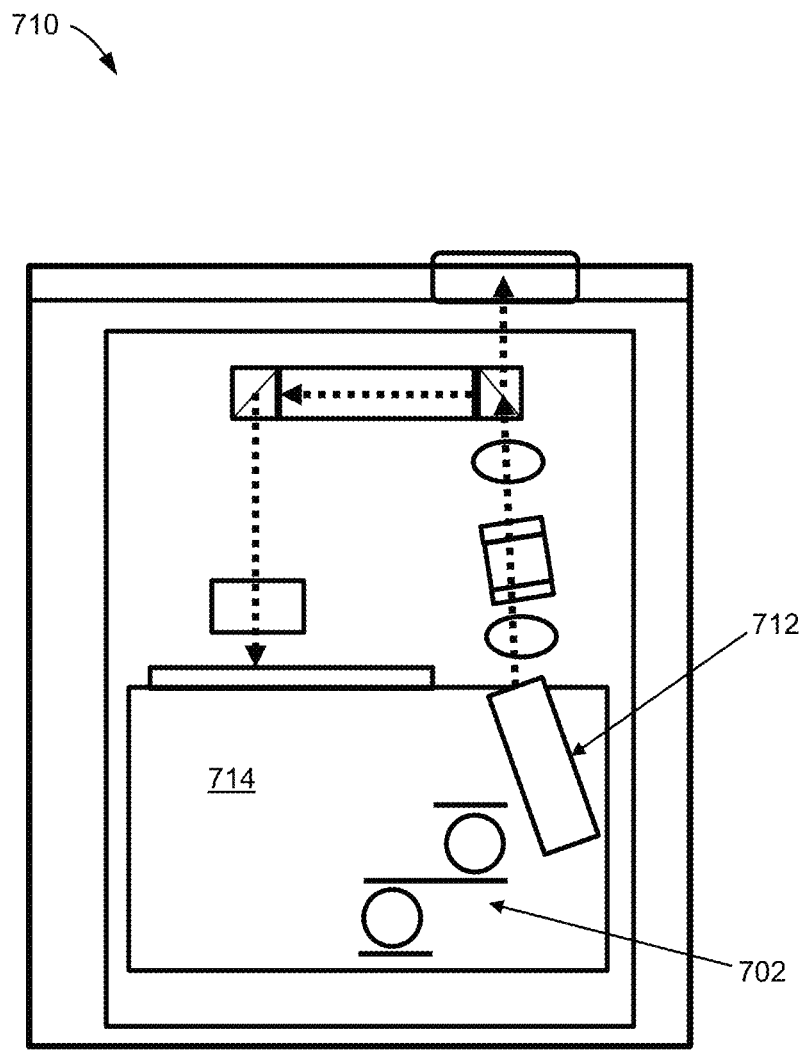

Referring to FIG. 7B, an alternative implementation of a tunable laser module 710 includes a gain chip 712 mounted on the PIC chip 714. For example, flip-chip mounting can be performed using a controlled collapsed chip connection that uses solder bumps (e.g., a gold tin alloy) between chip pads, or epi-up mounting can be performed using a cavity that has been etched within the PIC chip 714 using deep reactive ion etching (DRIE), and/or chemical etching. This enables the length of the tunable laser module 710 to be shortened. The output of the gain chip 712 is still emitted in air, so the gain chip 712 does not expose the PIC chip 714 to a large amount of optical power. Also, the length tolerance is not critical since one end is overhanging air. A heatsink is provided for the gain chip 712 through the PIC chip 714.

Figure 7C:
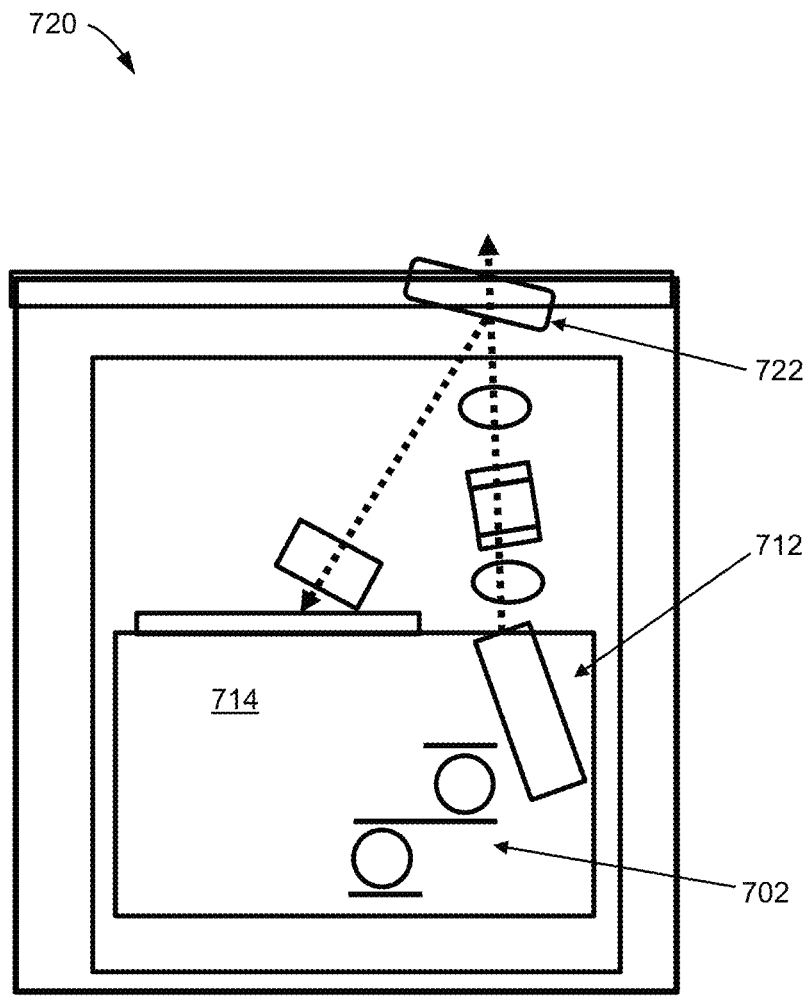

Referring to FIG. 7C, an alternative implementation of a tunable laser module 720 includes a beam coupler 722 that includes a surface coated as a beamsplitter to split a predetermined fraction of the power (e.g., more than half, or in some implementations between around 75%-95%) to be provided as an output beam of light and reflects the rest of the light to continue circulating in the tunable laser module 720.

Figure 7D:
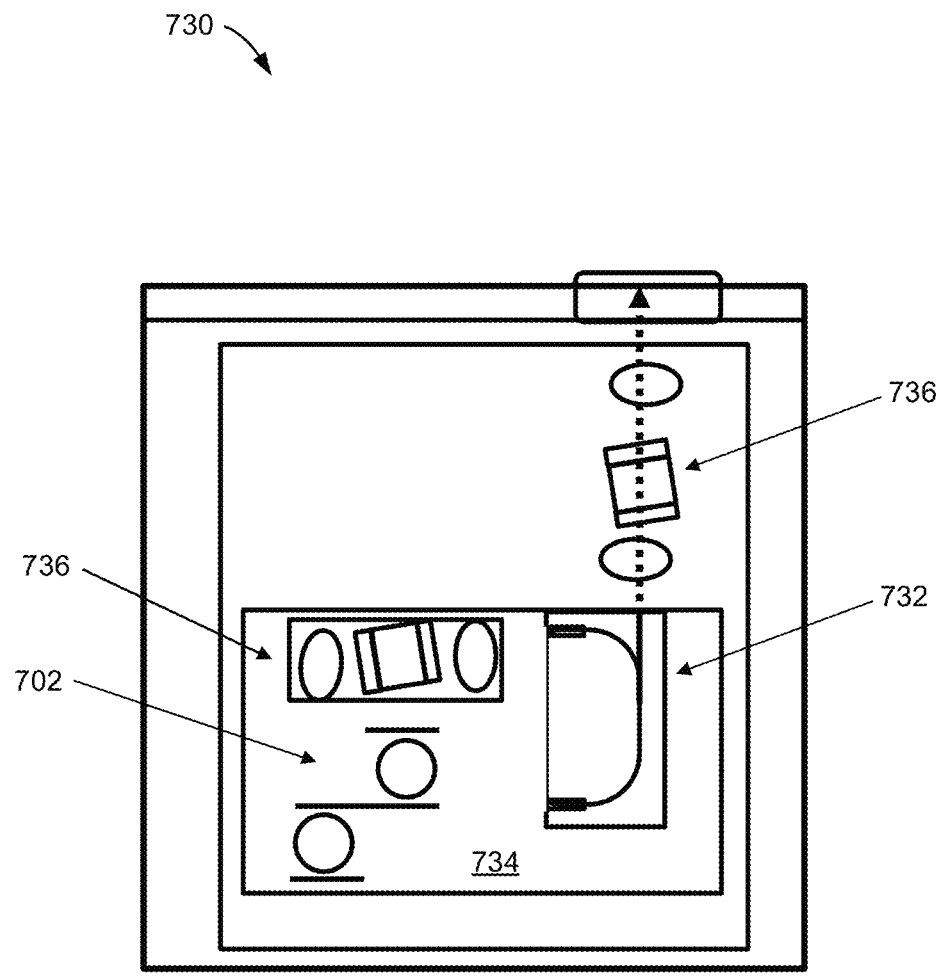

Referring to FIG. 7D, an alternative implementation of a tunable laser module 730 includes a gain chip 732 integrated within the PIC chip 734, with a curved waveguide that includes an integrated splitter that serves as an output coupler for a ring path that is contained entirely within the PIC chip 734. In this implementation, an integrated optical isolator 736 (e.g., using a magneto-optical material such as Ci:YIG thin-film deposited on a waveguide or inserted within an etched cavity with lenses on either side), and an integrated bandpass filter (not shown) (e.g., using a wideband MZI) are also included within the PIC chip 734.

Figure 7E:
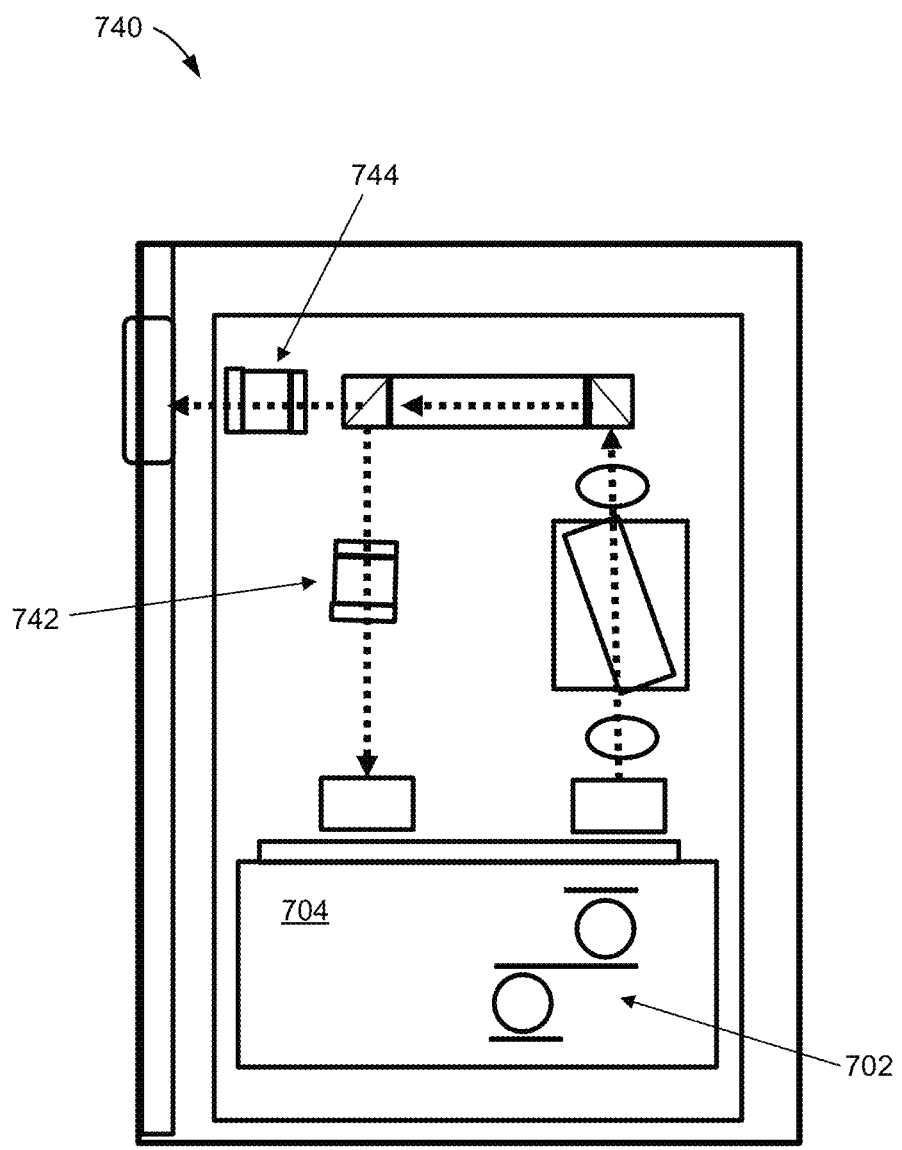

Referring to FIG. 7E, an alternative implementation of a tunable laser module 740 includes a free space optical isolator 742 inside the ring path and a free space optical isolator 744 outside the ring path.

Figure 7F:
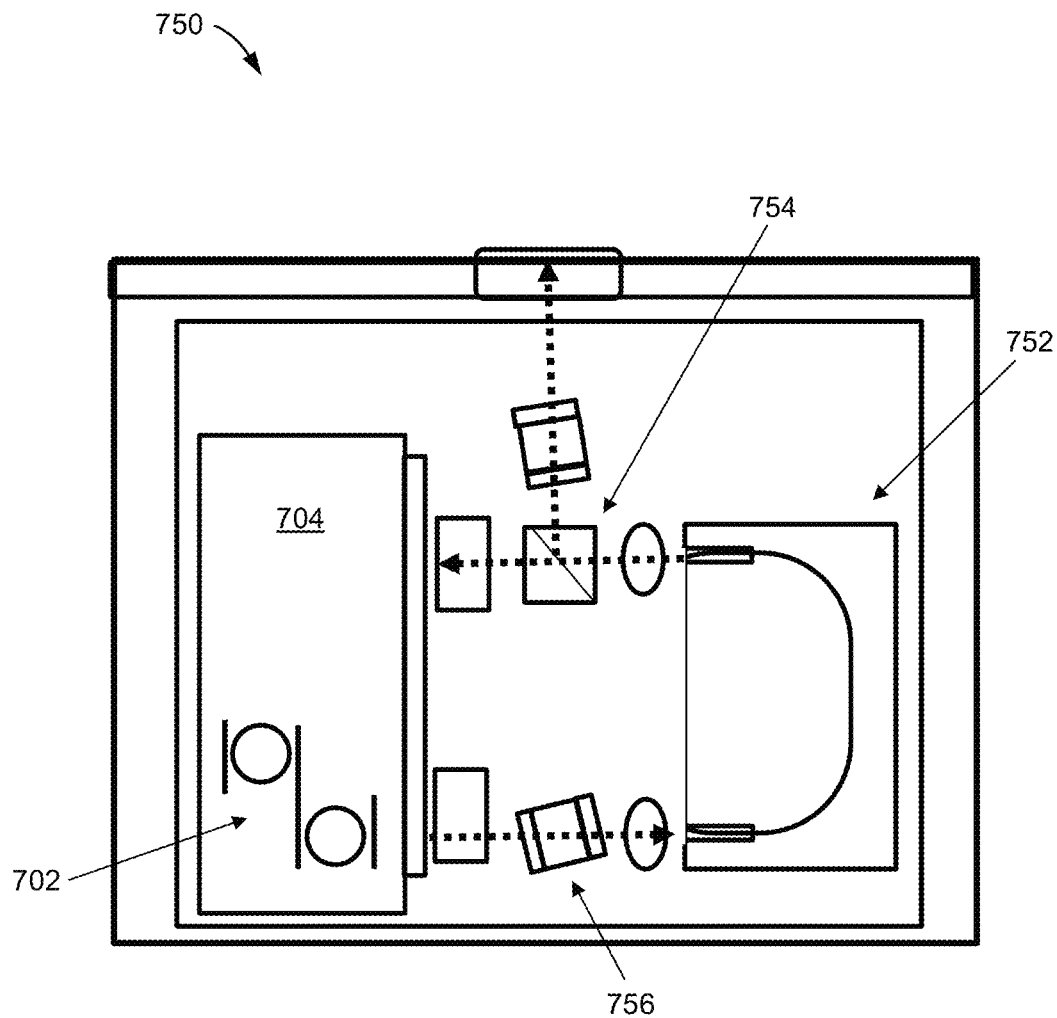

Referring to FIG. 7F, an alternative implementation of a tunable laser module 750 includes a gain chip 752 with a curved waveguide but without a splitter. So, there is a free space output coupler 754 that provides the output beam, and a free space isolator 756 within the ring path.

Figure 7G:
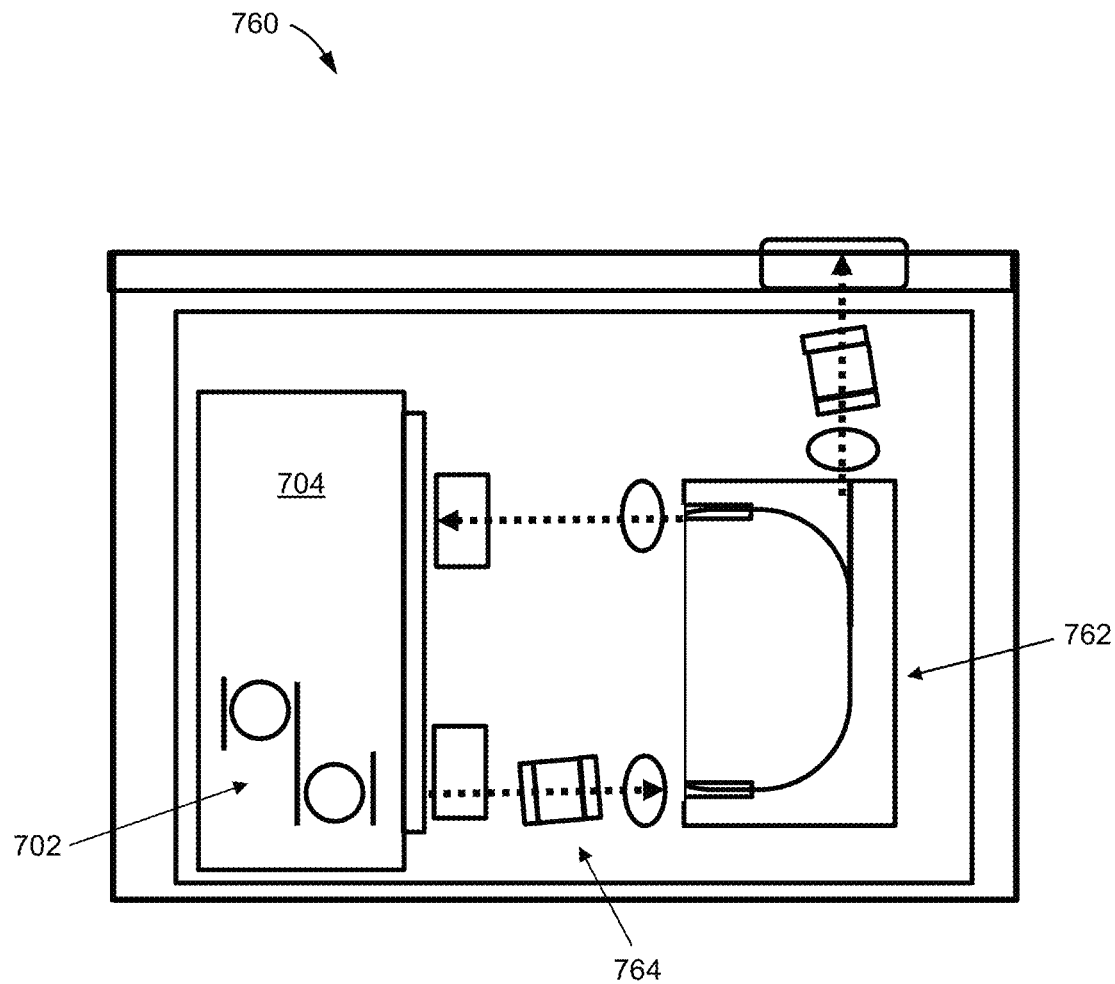

Referring to FIG. 7G, an alternative implementation of a tunable laser module 760 includes a gain chip 762 with a curved waveguide that includes an integrated splitter that serves as an output coupler. But, in this implementation the ring path includes a free space isolator 764.

Figure 7H:
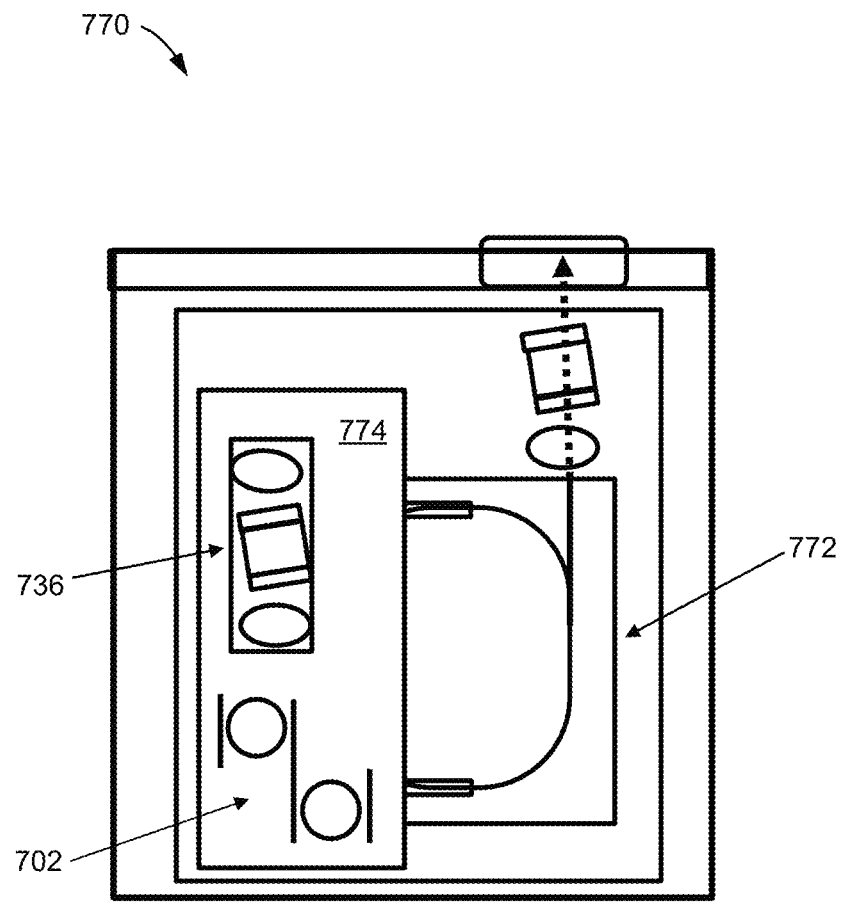

Referring to FIG. 7H, an alternative implementation of a tunable laser module 770 includes a gain chip 772 separate from but coupled to the PIC chip 774, with a curved waveguide that includes an integrated splitter that serves as an output coupler for a ring path that goes between the gain chip 772 and the PIC chip 774. In this implementation, an integrated optical isolator 736 and an integrated bandpass filter (not shown) (e.g., using a wideband MZI) are also included within the PIC chip 774.

Figure 7I:
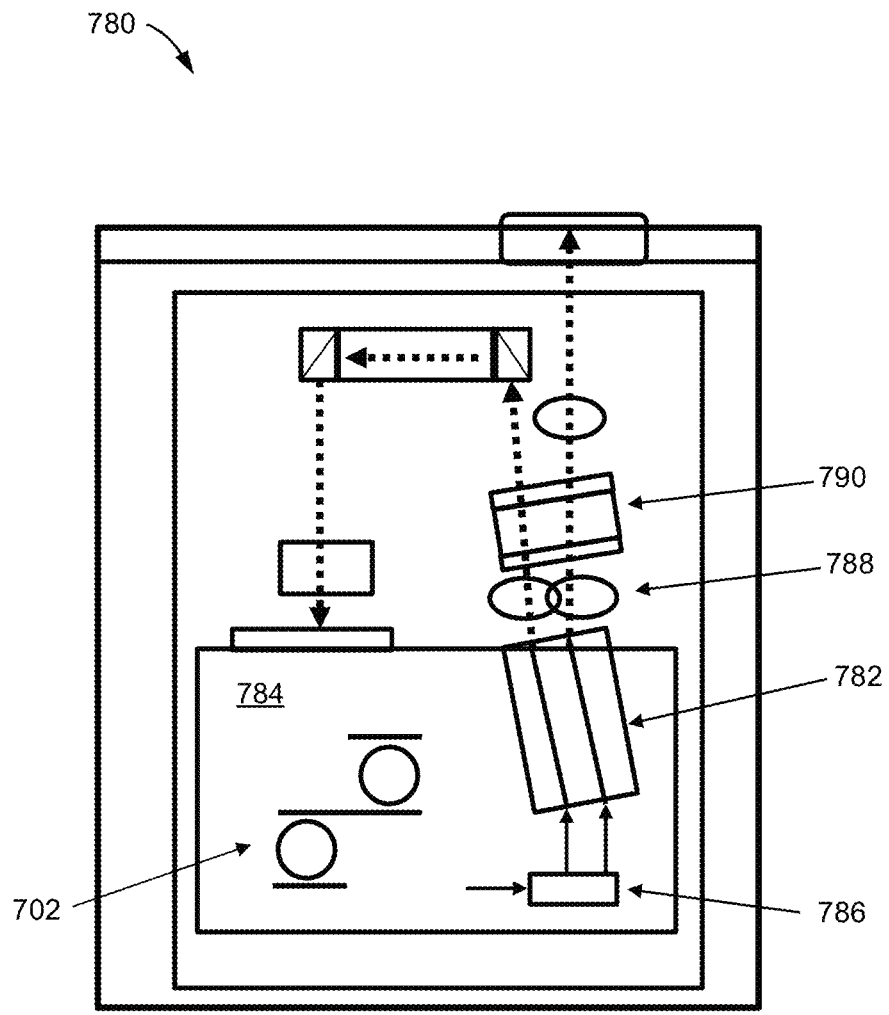

Referring to FIG. 7I, an alternative implementation of a tunable laser module 780 includes a dual medium chip 782 with a gain medium section on the left for lower-power operation over a portion ring path of the laser, and a semiconductor optical amplifier (SOA) section on the right for higher-power operation over an output coupling path. The dual medium chip 782 can be mounted to the PIC chip 784, for example, using a flip-chip or epi-up configuration, as described above. An integrated optical splitter 786 serves as the output coupler that splits a predetermined fraction of the power (e.g., more than half, or in some implementations between around 75%-95%) to the right SOA section that outputs light through a right lens of a dual lens array 788 as an output beam of light, and splits the rest of the light to the left gain medium section that outputs light through a left lens of the dual lens array 788 around the ring path of the tunable laser module 780. There is also a dual optical isolator 790 in this example.

FIGS. 8A and 8B show examples of gain chip integration configurations. FIG. 8A shows an example of an epi-up configuration 800, as mentioned above, and FIG. 8B shows an example of a flip-chip configuration 810, as mentioned above. Referring to FIG. 8A, a gain chip 802 is positioned inside a cavity of a substrate 804 with contacts of an epitaxial side facing up, and with portions of a waveguide 806 between the gain chip 802 and the substrate 804 aligned. Referring to FIG. 8B, a gain chip 812 is positioned inside a shallower cavity of a substrate 814 with contacts of an epitaxial side facing down, and with portions of a waveguide 816 between the gain chip 812 and the substrate 814 aligned. Other gain chip integration configurations are also possible, as mentioned above.

Figure 9:
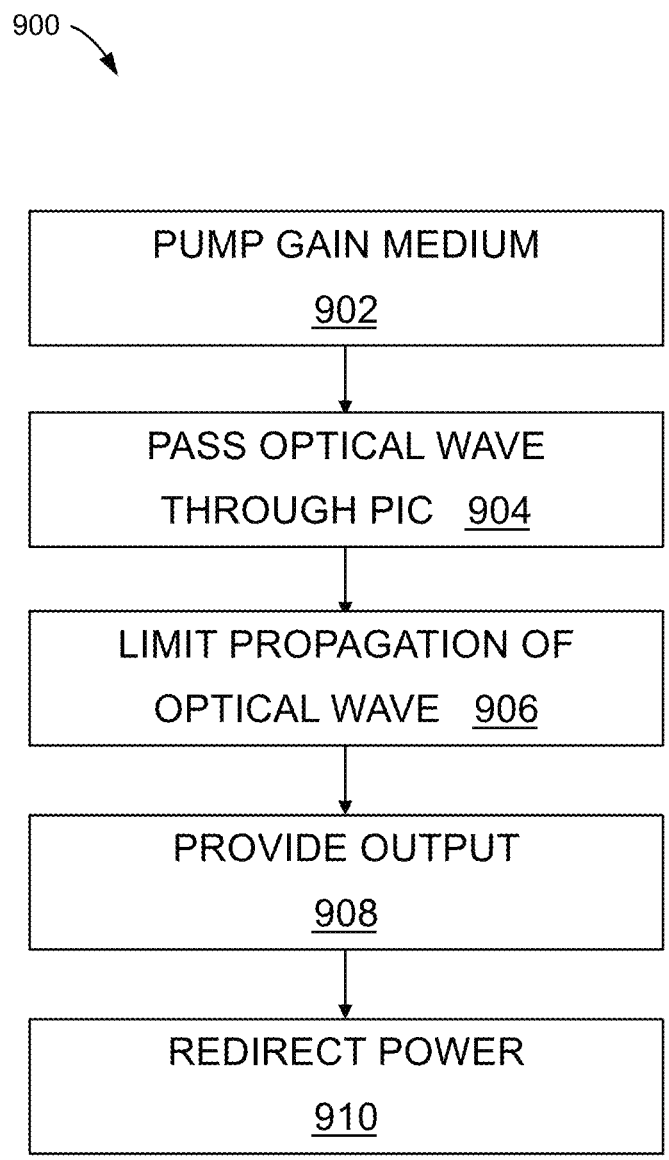
FIG. 9 is a flowchart of an example procedure for operating the tunable laser module.

FIG. 9 shows a flowchart for an example procedure 900 for operating a tunable laser source as described herein. The procedure 900 includes, in no particular order, pumping (902) a gain medium by a pump source, and passing (904) an optical wave through a PIC. The PIC comprises: a substrate comprising silicon, a plurality of photonic structures, an input port coupling an optical wave into a waveguide formed in the PIC, and an output port coupling an optical wave out of a waveguide formed in the PIC. The procedure 900 includes limiting (906) propagation of an optical wave circulating around a closed path of a laser ring cavity using an optical isolator such that, when the pump source exceeds a lasing threshold, the optical wave propagates in a single direction through the gain medium and the PIC. The procedure 900 also includes providing (908), from output coupler, an output that comprises a fraction of the power of an optical wave that is incident upon the output coupler; and redirecting (910) remaining power of the optical wave around the closed path of the laser ring cavity. Since the procedure corresponds to operation of a laser ring cavity, these steps do not necessarily occur in any particular order, but are occurring concurrently as light circulates around the ring cavity based on the arrangement of elements within the laser ring cavity, as in the examples described herein, or any other examples that are compatible with limiting power in the PIC. For example, implementations should ensure that light is coupled into the PIC after light from the gain medium has been coupled out so that the power is relatively low within the PIC.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus comprising:
   a gain medium configured to be pumped by a pump source;
   a photonic integrated circuit (PIC) comprising
      a substrate comprising silicon,
      a plurality of photonic structures,
      an input port coupling an optical wave into a waveguide formed in the PIC, and
      an output port coupling an optical wave out of a waveguide formed in the PIC;
   an optical isolator configured to limit propagation of an optical wave circulating around a closed path of a laser ring cavity such that, when the pump source exceeds a lasing threshold, the optical wave propagates in a single direction through the gain medium and the PIC, where the laser ring cavity comprises a plurality of frequency selective filters for selecting a frequency of the output including a coarse frequency selective filter characterized by a first linewidth cascaded with a fine frequency selective filter characterized by a second linewidth, where the second linewidth is different from the first linewidth; and
   an output coupler configured to provide an output that comprises a fraction of the power of an optical wave that is incident upon the output coupler and to redirect remaining power of the optical wave around the closed path of the laser ring cavity, where the fraction is greater than 0.5.

2. The apparatus of claim 1, wherein the PIC is positioned in the laser ring cavity such that the optical wave propagating on a portion of the closed path between the gain medium and the PIC is redirected by the output coupler after exiting the gain medium and before being received at the input port of the PIC.

3. The apparatus of claim 1, wherein the coarse frequency selective filter comprises at least one of the photonic structures in the PIC.

4. The apparatus of claim 3, wherein the coarse frequency selective filter comprises at least one Mach-Zehnder interferometer.

5. The apparatus of claim 4, wherein the coarse frequency selective filter comprises a plurality of Mach-Zehnder interferometers in series configured to substantially align their transmission peaks for a selected frequency.

6. The apparatus of claim 3, wherein the fine frequency selective filter is located outside of the PIC.

7. The apparatus of claim 6, wherein the fine frequency selective filter comprises a Fabry-Perot filter.

8. The apparatus of claim 3, wherein the fine frequency selective filter comprises a ring resonator formed from at least one of the photonic structures in the PIC.

9. The apparatus of claim 1, wherein the coarse frequency selective filter is characterized by a first free spectral range, and the fine frequency selective filter is characterized by a second free spectral range, where the second free spectral range is different from the first free spectral range.

10. The apparatus of claim 1, wherein the plurality of photonic structures comprise at least two of: a frequency selective filter, a photodiode, a frequency locker, or a wavemeter.

11. The apparatus of claim 1, wherein the plurality of photonic structures comprise a waveguide splitter that splits off a portion of the optical wave propagating between the input port and the output port of the PIC.

12. The apparatus of claim 11, wherein the waveguide splitter provides the portion of the optical wave to at least one of the photonic structures in the PIC.

13. The apparatus of claim 1, wherein the gain medium is mounted on the PIC using a flip-chip mounting configuration, or an epi-up mounting configuration.

14. The apparatus of claim 1, wherein the optical isolator comprises a non-reciprocal optical medium, and is located outside the PIC.

15. The apparatus of claim 1, wherein the fraction is greater than 0.8.

16. The apparatus of claim 1, wherein the optical isolator is formed in the PIC.

17. The apparatus of claim 1, wherein the output coupler is formed in the PIC.

18. A method comprising:
   pumping a gain medium by a pump source;
   passing an optical wave through a photonic integrated circuit (PIC) that comprises a substrate comprising silicon,
a plurality of photonic structures,
an input port coupling an optical wave into a waveguide formed in the PIC, and
an output port coupling an optical wave out of a waveguide formed in the PIC;
limiting propagation of an optical wave circulating around a closed path of a laser ring cavity using an optical isolator such that, when the pump source exceeds a lasing threshold, the optical wave propagates in a single direction through the gain medium and the PIC, where the laser ring cavity comprises a plurality of frequency selective filters for selecting a frequency of the output including a coarse frequency selective filter characterized by a first linewidth cascaded with a fine frequency selective filter characterized by a second linewidth, where the second linewidth is different from the first linewidth; and
providing, from output coupler, an output that comprises a fraction of the power of an optical wave that is incident upon the output coupler, and redirecting remaining power of the optical wave around the closed path of the laser ring cavity, where the fraction is greater than 0.5.

19. The method of claim 18, wherein the coarse frequency selective filter is characterized by a first free spectral range, and the fine frequency selective filter is characterized by a second free spectral range, where the second free spectral range is different from the first free spectral range.

* * * * *